United States Patent
Lee et al.

(10) Patent No.: US 8,853,855 B2
(45) Date of Patent: Oct. 7, 2014

(54) INTEGRATED CIRCUIT PACKAGING SYSTEM WITH CONDUCTIVE PILLARS AND MOLDED CAVITIES AND METHOD OF MANUFACTURE THEREOF

(75) Inventors: KyungHoon Lee, Icheon (KR); DaeSik Choi, Seoul (KR); Sooyoung Lee, Icheon-si (KR)

(73) Assignee: STATS ChipPAC Ltd., Singapore (SG)

( * ) Notice: Subject to any disclaimer, the term of this patent is extended or adjusted under 35 U.S.C. 154(b) by 201 days.

(21) Appl. No.: 13/422,649

(22) Filed: Mar. 16, 2012

(65) Prior Publication Data
US 2013/0241053 A1    Sep. 19, 2013

(51) Int. Cl.
*H01L 21/56*    (2006.01)

(52) U.S. Cl.
USPC ............... 257/737; 438/126; 257/E21.705; 257/E23.142

(58) Field of Classification Search
None
See application file for complete search history.

(56) References Cited

U.S. PATENT DOCUMENTS

| | | | |
|---|---|---|---|
| 5,739,187 A * | 4/1998 | Asano et al. | 523/451 |
| 7,185,426 B1 | 3/2007 | Hiner et al. | |
| 7,923,304 B2 | 4/2011 | Choi et al. | |
| 8,035,235 B2 | 10/2011 | Jang et al. | |
| 2011/0140259 A1 | 6/2011 | Cho et al. | |
| 2011/0149493 A1 | 6/2011 | Kwon et al. | |
| 2011/0233751 A1 * | 9/2011 | Bae et al. | 257/692 |
| 2012/0013000 A1 * | 1/2012 | Haba | 257/737 |
| 2012/0032341 A1 * | 2/2012 | Chao et al. | 257/774 |

OTHER PUBLICATIONS

U.S. Appl. No. 13/298,267, filed Nov. 16, 2011, Kim et al.
U.S. Appl. No. 13/163,643, filed Jun. 17, 2011, Yang et al.

* cited by examiner

*Primary Examiner* — Charles Garber
*Assistant Examiner* — Alia Sabur
(74) *Attorney, Agent, or Firm* — Ishimaru & Associates LLP

(57) ABSTRACT

A method of manufacture of an integrated circuit packaging system includes: providing a substrate; forming a conductive post on the substrate, the conductive post includes a vertical side; attaching an integrated circuit to the substrate; and forming an encapsulant including a molded cavity, the vertical side circumscribed by and exposed within the molded cavity from the encapsulant.

9 Claims, 6 Drawing Sheets

INTEGRATED CIRCUIT PACKAGING SYSTEM WITH CONDUCTIVE PILLARS AND MOLDED CAVITIES AND METHOD OF MANUFACTURE THEREOF

TECHNICAL FIELD

The present invention relates generally to an integrated circuit packaging system and more particularly to an integrated circuit packaging system utilizing a pillar and cavity.

BACKGROUND

The rapidly growing market for portable electronic devices, e.g. cellular phones, laptop computers, and personal digital assistants (PDAs), is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems can be more intelligent, have higher density, use less power, operate at higher speed, and can include mixed technology devices and assembly structures at lower cost than today.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system, including: providing a substrate; forming a conductive post on the substrate, the conductive post includes a vertical side; attaching an integrated circuit to the substrate; and forming an encapsulant including a molded cavity, the vertical side circumscribed by and exposed within the molded cavity from the encapsulant.

The present invention provides an integrated circuit packaging system, including: a substrate; a conductive post formed on the substrate, the conductive post includes a top side and a vertical side perpendicular to the top side; an integrated circuit attached to the substrate; and an encapsulant including a molded cavity, the conductive post circumscribed by the encapsulant and the vertical side exposed within the molded cavity from the encapsulant.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
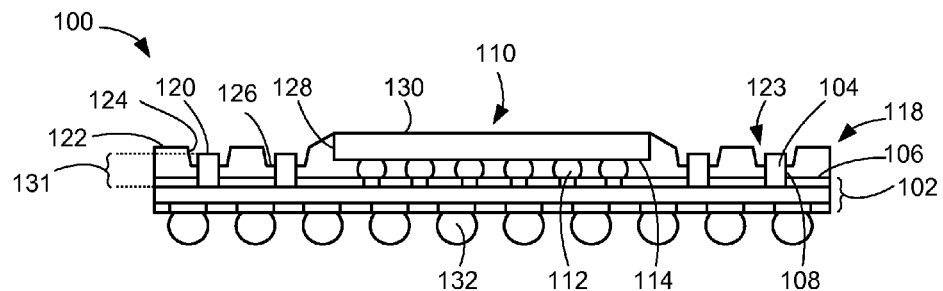
FIG. 1 is a cross-sectional view of an integrated circuit packaging system along the line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes can be made without departing from the scope of the present invention.

In the following description, numerous specific details are given to provide a thorough understanding of the invention. However, it will be apparent that the invention can be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to an active side of an integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements without having any intervening material.

The term "processing" as used herein includes deposition of material or photoresist, patterning, exposure, development, etching, cleaning, and/or removal of the material or photoresist as required in forming a described structure.

Figure 2:
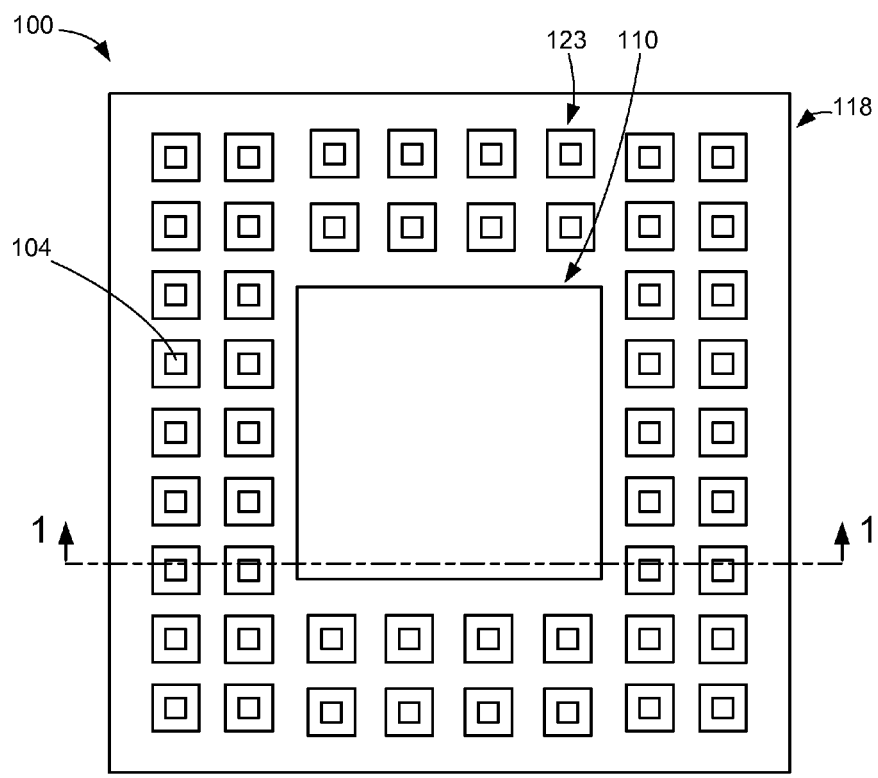
FIG. 2 is a top view of the integrated circuit packaging system of FIG. 1.

Referring now to FIG. 1, therein is shown a cross-sectional view of an integrated circuit packaging system 100 along the line 1-1 of FIG. 2 in a first embodiment of the present invention. The integrated circuit packaging system 100 is shown having a substrate 102.

The substrate 102 is defined as a structure capable of electrical connection, signal routing with internal signal to signal isolation, and providing structural support for components to be mounted thereto. The substrate 102 can be a rigid or semi-rigid support structure such as laminated plastic or ceramic.

Conductive posts 104 can be formed in direct contact with the substrate 102. The conductive posts 104 can be formed below a top substrate side 106 of the substrate 102 and extend into the substrate 102.

The conductive posts 104 can be an electrically conductive rigid structure such as metal or a conductive polymer. The conductive posts 104 can have vertical sides 108. The vertical sides 108 can be a vertical external surface such as a flat vertical side or a vertical side of an orthogonal cylinder. An integrated circuit 110 can be mounted above the substrate 102. The conductive posts 104 can be arranged in two rows around the integrated circuit 110.

Interconnects 112 can be formed on an active side 114 of the integrated circuit 110. The interconnects 112 can be an electrically conductive signal routing structure such as solder, a conductive polymer, or other metal. The active side 114 is defined as a side of the integrated circuit 110 having active circuitry fabricated thereon. The active side 114 of the integrated circuit 110 can face the substrate 102 and be distanced from the substrate 102 by the interconnects 112.

The conductive posts 104, the integrated circuit 110, and the interconnects 112 can have an encapsulant 118 formed thereon. The encapsulant 118 can be formed by film assisted molding to expose the vertical sides 108 and a top side 120 of the conductive posts 104. The vertical sides 108 of the conductive posts 104 can be in direct contact with the encapsulant 118 near the substrate 102 to provide mechanical stability and exposed near the top side 120 to provide increased connectivity.

The encapsulant 118 can have an upper surface 122 that can be flat and parallel to the substrate 102 and circumscribe molded cavities 123. The encapsulant 118 can also have the molded cavities 123 around the conductive posts 104 and exposing the conductive posts 104 from the encapsulant 118. The molded cavities 123 are defined as a structure formed simultaneously with placement and curing of the encapsulant 118 and not a later process.

The molded cavities 123 can have sloped sidewalls 124 extending toward a bottom cavity surface 126 of the encapsulant 118. The sloped sidewalls 124 can have a slope of greater than horizontal and less than vertical within the molded cavities 123. The bottom cavity surface 126 of the encapsulant 118 can extend from the sloped sidewalls 124 of the encapsulant 118 to directly contact the vertical sides 108 of the conductive posts 104. The sloped sidewalls 124 can preferably have an angle of greater than zero degrees and less than forty-five degrees measured down from a vertical axis.

It has been discovered that the molded cavities having the sloped sidewalls 124 with an angle of greater than zero degrees and less than forty-five degrees measured down from a vertical axis is critical to achieve the unexpected benefits of increasing input/output density while unexpectedly improving the mechanical support of external connections (not shown).

The top side 120 of the conductive posts 104 can be below the upper surface 122 of the encapsulant 118 and yet exposed from the encapsulant 118. The conductive posts 104 can extend vertically from the bottom cavity surface 126 of the encapsulant 118.

The encapsulant 118 can also encapsulate the active side 114 and edges 128 of the integrated circuit 110. The encapsulant 118 can extend from the sloped sidewalls 124 to directly contact the edges 128. The integrated circuit 110 can also have a non-active side 130 that is exposed from the encapsulant 118.

The non-active side 130 can be positioned above the upper surface 122 of the encapsulant 118 and above the top side 120 of the conductive posts 104. The vertical sides 108 of the conductive posts 104 can be perpendicular to the top side 120. The conductive posts 104 can have a height 131 larger than the interconnects 112 and extend within the edges 128 of the integrated circuit 110.

External interconnects 132 can be formed below the substrate 102. The external interconnects 132 can connect the substrate 102 to external board level connections or other devices.

Figure 5:
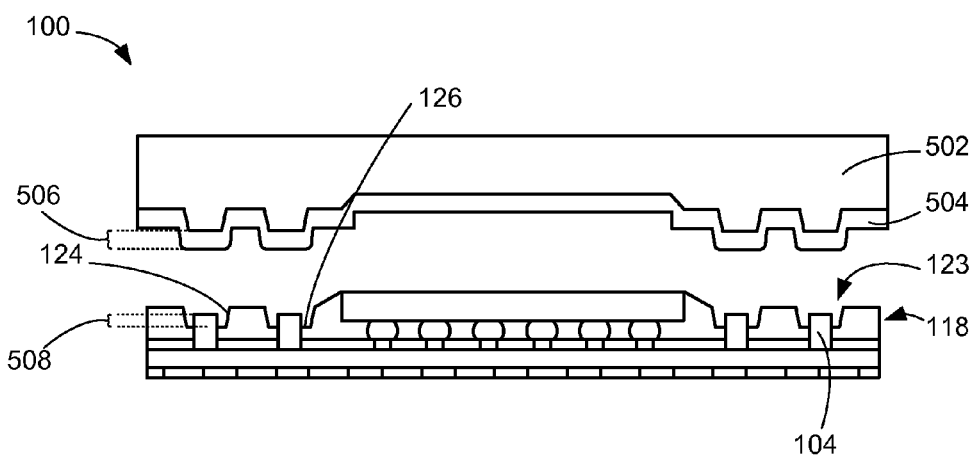
FIG. 5 is a cross-sectional view of the integrated circuit packaging system of FIG. 4 after an encapsulation phase of manufacture.

The molded cavities 123 of the encapsulant 118 can be formed by film assisted molding and have the physical characteristics of film assisted molding such as having a surface that oppositely correlates to the mold chase 502 of FIG. 5 but enlarged by the thickness of a film 504 of FIG. 5. The molded cavities 123 of the encapsulant 118 can also have the physical characteristics of surfaces similar to a mirror image of a mold chase 502 but slightly with slight corner distortions from the film 504 in corner regions. The encapsulant 118 having the upper surface 122, the sloped sidewalls 124, and the bottom surface 126 can also have the physical characteristics of being smooth, non-pitted, and non-carbonized.

The conductive posts 104 can also have physical characteristics from the film assisted molding process used to form the molded cavities 123 of the encapsulant 118. These physical characteristics can include smooth metal surface, not pitted or melted. The flat sides 108 of the conductive posts 104 can also be cleaner having fewer residues or mold flash of the encapsulant 118 thereon.

It has been discovered that encapsulant 118 having molded cavities 123 exposing the conductive posts 104 therefrom and the encapsulant 118 encapsulating the integrated circuit 110 decrease manufacturing costs and time by allowing the elimination of expensive extra process steps like laser ablation, and allows for interlayer dielectric crack inspection after the molding process and also improves performance by allowing finer pitch with the conductive posts 104, a thinner package profile and reduced strip warpage.

Referring now to FIG. 2, therein is shown a top view of the integrated circuit packaging system 100 of FIG. 1. The integrated circuit packaging system 100 is shown having the encapsulant 118 encapsulating the conductive posts 104 and the integrated circuit 110.

The encapsulant 118 is also shown having the molded cavities 123 formed therein surrounding and exposing the conductive posts 104. The molded cavities 123 are shown surrounding the integrated circuit 110.

Figure 3:
FIG. 3 is a cross-sectional view of the integrated circuit packaging system of FIG. 1 after a pillar formation phase of manufacture.

Referring now to FIG. 3, therein is shown a cross-sectional view of the integrated circuit packaging system 100 of FIG. 1 after a pillar formation phase of manufacture. The integrated circuit packaging system 100 is shown having the substrate 102 provided with the conductive posts 104 formed on the top substrate side 106 of the substrate 102. The conductive posts 104 can extend vertically from the substrate 102 and into the substrate 102 below the top substrate side 106 of the substrate 102.

Figure 4:
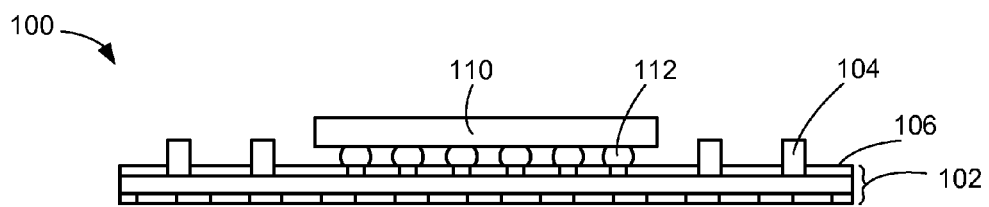
FIG. 4 is a cross-sectional view of the integrated circuit packaging system of FIG. 3 after an integrated circuit attach phase of manufacture.

Referring now to FIG. 4, therein is shown a cross-sectional view of the integrated circuit packaging system 100 of FIG. 3 after an integrated circuit attach phase of manufacture. The integrated circuit packaging system 100 is shown having the integrated circuit 110 attached and electrically connected to the top substrate side 106 of the substrate 102 with the interconnects 112. The integrated circuit 110 is shown attached to the substrate 102 between the conductive posts 104.

Referring now to FIG. 5, therein is shown a cross-sectional view of the integrated circuit packaging system 100 of FIG. 4 after an encapsulation phase of manufacture. The integrated circuit packaging system 100 is shown having the encapsulant 118.

The encapsulant 118 is shown having the molded cavities 123 formed with the sloped sidewalls 124 and the bottom cavity surface 126 around the conductive posts 104. A mold chase 502 is over and previously removed from the encapsulant 118.

The mold chase 502 is shown having the opposite shape of the encapsulant 118. Attached to the mold chase 502 is a film 504 that ensures the proper molding pressures and dimensions during the molding process.

The film 504 can have a film thickness 506 corresponding to the conductive posts 104 greater than thirty microns. The film thickness 506 corresponding to the conductive posts 104 can be larger than an exposed height 508 of the conductive posts 104 exposed within the molded cavities 123 of the encapsulant 118. Alternatively, the film 504 can have a gap corresponding to the conductive posts 104 for the conductive posts 104 to extend into and can contact the mold chase 502.

Figure 6:
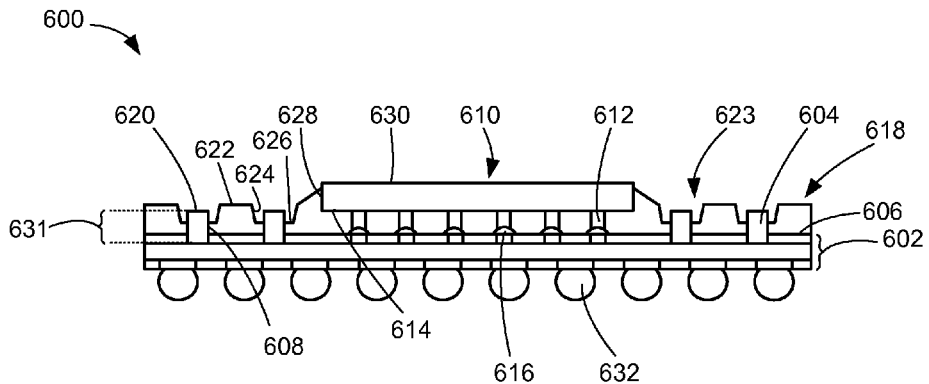
FIG. 6 is a cross-sectional view of an integrated circuit packaging system in a second embodiment of the present invention.

Referring now to FIG. 6, therein is shown a cross-sectional view of an integrated circuit packaging system 600 in a second embodiment of the present invention. The integrated circuit packaging system 600 is shown having a substrate 602.

The substrate 602 is defined as a structure capable of electrical connection, signal routing with internal signal to signal isolation, and providing structural support for components to be mounted thereto. The substrate 602 can be a rigid or semi-rigid support structure such as laminated plastic or ceramic.

Conductive posts 604 can be formed in direct contact with the substrate 602. The conductive posts 604 can be formed below a top substrate side 606 of the substrate 602 and extend into the substrate 602.

The conductive posts 604 can be an electrically conductive rigid structure such as metal or a conductive polymer. The conductive posts 604 can have vertical sides 608. The vertical sides 608 can be a vertical external surface such as a flat vertical side or a vertical side of an orthogonal cylinder. An integrated circuit 610 can be mounted above the substrate 602. The conductive posts 604 can be arranged in two rows around the integrated circuit 610.

Interconnects 612 can be formed on an active side 614 of the integrated circuit 610. The active side 614 is defined as a side of the integrated circuit 610 having active circuitry fabricated thereon. The active side 614 of the integrated circuit 610 can face the substrate 602 and be distanced from the substrate 602 by the interconnects 612.

The interconnects 612 can be attached to the top substrate side 606 of the substrate 602 with bumps 616 that can be conductive such as solder, a conductive polymer, or other metal. The conductive posts 604, the integrated circuit 610, and the interconnects 612 can have an encapsulant 618 formed thereon.

It has been discovered that the interconnects 612 and the bumps 616 increase the density of the interconnects 612 that the integrated circuit 610 can include.

The encapsulant 618 can be formed by film assisted molding to expose the vertical sides 608 and a top side 620 of the conductive posts 604. The vertical sides 608 of the conductive posts 604 can be in direct contact with the encapsulant 618 near the substrate 602 to provide mechanical stability and exposed near the top side 620 to provide increased connectivity. The Top side 620 of the conductive posts 604 can be coplanar with the active side 614 of the integrated circuit 610.

The encapsulant 618 can have an upper surface 622 that can be flat and parallel to the substrate 602 and circumscribe molded cavities 623. The encapsulant 618 can also have the molded cavities 623 around the conductive posts 604 and exposing the conductive posts 604 from the encapsulant 618. The molded cavities 623 are defined as a structure formed simultaneously with placement and curing of the encapsulant 618 and not a later process.

The molded cavities 623 can have sloped sidewalls 624 extending toward a bottom cavity surface 626 of the encapsulant 618. The sloped sidewalls 624 can have a slope of greater than horizontal and less than vertical within the molded cavities 623. The bottom cavity surface 626 of the encapsulant 618 can extend from the sloped sidewalls 624 of the encapsulant 618 to directly contact the vertical sides 608 of the conductive posts 604.

The top side 620 of the conductive posts 604 can be below the upper surface 622 of the encapsulant 618 and yet exposed from the encapsulant 618. The conductive posts 604 can extend vertically from the bottom cavity surface 626 of the encapsulant 618.

The encapsulant 618 can also encapsulate the active side 614 and edges 628 of the integrated circuit 610. The encapsulant 618 can extend from the sloped sidewalls 624 to directly contact the edges 628. The integrated circuit 610 can also have a non-active side 630 that is exposed from the encapsulant 618 angled from the sloped sidewalls 624 to the edges 628.

The non-active side 630 can be positioned above the upper surface 622 of the encapsulant 618 and above the top side 620 of the conductive posts 604. The vertical sides 608 of the conductive posts 604 can be perpendicular to the top side 620. The conductive posts 604 can have a height 631 larger than the interconnects 612 and the bumps 616 and extend up to the active side 614 of the integrated circuit 610.

External interconnects 632 can be formed below the substrate 602. The external interconnects 632 can connect the substrate 602 to external board level connections or other devices.

The molded cavities 623 of the encapsulant 618 can be formed by film assisted molding and have the physical characteristics of film assisted molding such as having a surface that oppositely correlates to a mold chase but enlarged by the thickness of a film. The molded cavities 623 of the encapsulant 618 can also have the physical characteristics of surfaces similar to a mirror image of a mold chase but slightly distorted by a film. The encapsulant 618 having the upper surface 622, the sloped sidewalls 624, and the bottom surface 626 can also have the physical characteristics of being smooth, non-pitted, and non-carbonized.

The conductive posts 604 can also have physical characteristics from the film assisted molding process used to form the molded cavities 623 of the encapsulant 618. These physical characteristics can include smooth metal surface, not pitted or melted. The flat sides 608 of the conductive posts 604 can also be cleaner having fewer residues or mold flash of the encapsulant 618 thereon.

It has been discovered that encapsulant 618 having molded cavities 623 exposing the conductive posts 604 therefrom and the encapsulant 618 encapsulating the integrated circuit 610 decrease manufacturing costs and time by allowing the elimination of expensive extra process steps like laser ablation, and allows for interlayer dielectric crack inspection after the molding process and also improves performance by allowing finer pitch with the conductive posts 604, a thinner package profile and reduced strip warpage.

Figure 7:
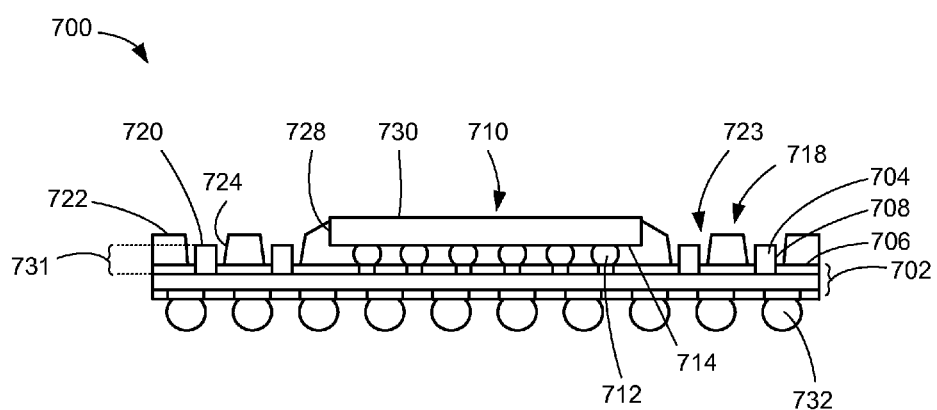
FIG. 7 is a cross-sectional view of an integrated circuit packaging system in a third embodiment of the present invention.

Referring now to FIG. 7, therein is shown a cross-sectional view of an integrated circuit packaging system 700 in a third embodiment of the present invention. The integrated circuit packaging system 700 is shown having a substrate 702.

The substrate 702 is defined as a structure capable of electrical connection, signal routing with internal signal to signal isolation, and providing structural support for components to be mounted thereto. The substrate 702 can be a rigid or semi-rigid support structure such as laminated plastic or ceramic.

Conductive posts 704 can be formed in direct contact with the substrate 702. The conductive posts 704 can be formed below a top substrate side 706 of the substrate 702 and extend into the substrate 702.

The conductive posts 704 can be an electrically conductive rigid structure such as metal or a conductive polymer. The conductive posts 704 can have vertical sides 708. The vertical sides 708 can be a vertical external surface such as a flat vertical side or a vertical side of an orthogonal cylinder. An integrated circuit 710 can be mounted above the substrate 702. The conductive posts 704 can be arranged in two rows around the integrated circuit 710.

Interconnects 712 can be formed on an active side 714 of the integrated circuit 710. The interconnects 712 can be an electrically conductive signal routing structure such as solder, a conductive polymer, or other metal. The active side 714 is defined as a side of the integrated circuit 710 having active circuitry fabricated thereon. The active side 714 of the integrated circuit 710 can face the substrate 702 and be distanced from the substrate 702 by the interconnects 712.

The conductive posts 704, the integrated circuit 710, and the interconnects 712 can have an encapsulant 718 formed thereon. The encapsulant 718 can be formed by film assisted molding to expose the vertical sides 708 and a top side 720 of the conductive posts 704. The vertical sides 708 of the conductive posts 704 can be fully exposed from the encapsulant 718 above the substrate 702. The Top side 720 of the conductive posts 704 can be coplanar with the active side 714 of the integrated circuit 710.

The encapsulant 718 can have an upper surface 722 that can be flat and parallel to the substrate 702 and circumscribe molded cavities 723. The encapsulant 718 can also have the molded cavities 723 around the conductive posts 704 and exposing the conductive posts 704 from the encapsulant 718. The molded cavities 723 are defined as a structure formed simultaneously with placement and curing of the encapsulant 718 and not a later process.

The molded cavities 723 can have sloped sidewalls 724 extending toward the top substrate side 706 of the substrate 702. The sloped sidewalls 724 can have a slope of greater than horizontal and less than vertical within the molded cavities 723. The top substrate side 706 of the substrate 702 can be exposed from the encapsulant 718 from the sloped sidewalls 724 of the encapsulant 718 to the vertical sides 708 of the conductive posts 704. The top side 720 of the conductive posts 704 can be below the upper surface 722 of the encapsulant 718 and yet exposed from the encapsulant 718.

It has been discovered that the molded cavities 723 that expose the top substrate side 706 of the substrate 702 improves adhesion of the conductive post 704 to external components.

The encapsulant 718 can also encapsulate the active side 714 and edges 728 of the integrated circuit 710. The encapsulant 718 can extend from the sloped sidewalls 724 to directly contact the edges 728. The integrated circuit 710 can also have a non-active side 730 that is exposed from the encapsulant 718.

The non-active side 730 can be positioned above the upper surface 722 of the encapsulant 718 and above the top side 720 of the conductive posts 704. The vertical sides 708 of the conductive posts 704 can be perpendicular to the top side 720. The conductive posts 704 can have a height 731 larger than the interconnects 712 and extend up to the active side 714 of the integrated circuit 710.

External interconnects 732 can be formed below the substrate 702. The external interconnects 732 can connect the substrate 702 to external board level connections or other devices.

The molded cavities 723 of the encapsulant 718 can be formed by film assisted molding and have the physical characteristics of film assisted molding such as having a surface that oppositely correlates to a mold chase but enlarged by the thickness of a film. The molded cavities 723 of the encapsulant 718 can also have the physical characteristics of surfaces similar to a mirror image of a mold chase but slightly distorted by a film. The encapsulant 718 having the upper surface 722 and the sloped sidewalls 724 can also have the physical characteristics of being smooth, non-pitted, and non-carbonized.

The conductive posts 704 can also have physical characteristics from the film assisted molding process used to form the molded cavities 723 of the encapsulant 718. These physical characteristics can include smooth metal surface, not pitted or melted. The flat sides 708 of the conductive posts 704 can also be cleaner having fewer residues or mold flash of the encapsulant 718 thereon.

It has been discovered that encapsulant 718 having molded cavities 723 exposing the conductive posts 704 therefrom and the encapsulant 718 encapsulating the integrated circuit 710 decrease manufacturing costs and time by allowing the elimination of expensive extra process steps like laser ablation, and allows for interlayer dielectric crack inspection after the molding process and also improves performance by allowing finer pitch with the conductive posts 704, a thinner package profile and reduced strip warpage.

Figure 8:
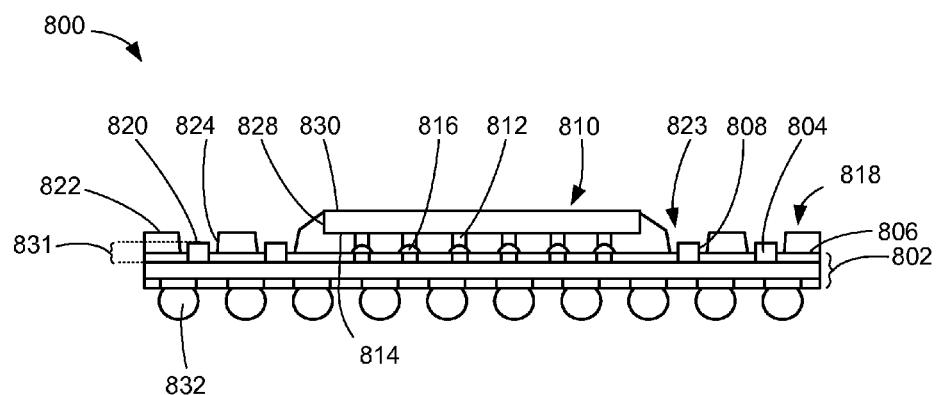
FIG. 8 is a cross-sectional view of an integrated circuit packaging system in a fourth embodiment of the present invention.

Referring now to FIG. 8, therein is shown a cross-sectional view of an integrated circuit packaging system 800 in a fourth embodiment of the present invention. The integrated circuit packaging system 800 is shown having a substrate 802.

The substrate 802 is defined as a structure capable of electrical connection, signal routing with internal signal to signal isolation, and providing structural support for components to be mounted thereto. The substrate 802 can be a rigid or semi-rigid support structure such as laminated plastic or ceramic.

Conductive posts 804 can be formed in direct contact with the substrate 802. The conductive posts 804 can be formed below a top substrate side 806 of the substrate 802 and extend into the substrate 802.

The conductive posts 804 can be an electrically conductive rigid structure such as metal or a conductive polymer. The conductive posts 804 can have vertical sides 808. The vertical sides 808 can be a vertical external surface such as a flat vertical side or a vertical side of an orthogonal cylinder. An integrated circuit 810 can be mounted above the substrate 802. The conductive posts 804 can be arranged in two rows around the integrated circuit 810.

Interconnects 812 can be formed on an active side 814 of the integrated circuit 810. The active side 814 is defined as a side of the integrated circuit 810 having active circuitry fabricated thereon. The active side 814 of the integrated circuit 810 can face the substrate 802 and be distanced from the substrate 802 by the interconnects 812. The interconnects 812 can be attached to the top substrate side 806 of the substrate 802 with bumps 816 that can be conductive such as solder, a conductive polymer, or other metal.

The conductive posts 804, the integrated circuit 810, and the interconnects 812 can have an encapsulant 818 formed thereon. The encapsulant 818 can be formed by film assisted molding. The encapsulant 818 can have an upper surface 822 that can be flat and parallel to the substrate 802 and circumscribe molded cavities 823. The encapsulant 818 can also have the molded cavities 823 around the conductive posts 804 and exposing the conductive posts 804 from the encapsulant 818. The molded cavities 823 are defined as a structure formed simultaneously with placement and curing of the encapsulant 818 and not a later process.

The molded cavities 823 can have sloped sidewalls 824 extending toward the top substrate side 806 of the substrate 802. The sloped sidewalls 824 can have a slope of greater than horizontal and less than vertical within the molded cavities 823. The top substrate side 806 of the substrate 802 can be exposed from the encapsulant 818 from the sloped sidewalls 824 of the encapsulant 818 to the vertical sides 808 of the conductive posts 804. The top side 820 of the conductive posts 804 can be below the upper surface 822 of the encapsulant 818 and yet exposed from the encapsulant 818.

It has been discovered that the molded cavities 823 that expose the top substrate side 806 of the substrate 802 improves adhesion of the conductive post 804 to external components.

It has also been discovered that the interconnects 812 and the bumps 816 increases the density of the interconnects 812 that the integrated circuit 810 can include.

The encapsulant 818 can also encapsulate the active side 814 and edges 828 of the integrated circuit 810. The encapsulant 818 can extend from the sloped sidewalls 824 to directly contact the edges 828. The integrated circuit 810 can also have a non-active side 830 that is exposed from the encapsulant 818.

The non-active side 830 can be positioned above the upper surface 822 of the encapsulant 818. The active side 814 can be positioned above the top side 820 of the conductive posts 804. The conductive posts 804 can have a height 831 less than the interconnects 812 and the bumps 816 and extend below the active side 814 of the integrated circuit 810.

External interconnects 832 can be formed below the substrate 802. The external interconnects 832 can connect the substrate 802 to external board level connections or other devices.

The molded cavities 823 of the encapsulant 818 can be formed by film assisted molding and have the physical characteristics of film assisted molding such as having a surface that oppositely correlates to a mold chase but enlarged by the thickness of a film. The molded cavities 823 of the encapsulant 818 can also have the physical characteristics of surfaces similar to a mirror image of a mold chase but slightly distorted by a film. The encapsulant 818 having the upper surface 822 and the sloped sidewalls 824 can also have the physical characteristics of being smooth, non-pitted, and non-carbonized.

The conductive posts 804 can also have physical characteristics from the film assisted molding process used to form the molded cavities 823 of the encapsulant 818. These physical characteristics can include smooth metal surface, not pitted or melted. The flat sides 808 of the conductive posts 804 can also be cleaner having fewer residues or mold flash of the encapsulant 818 thereon.

It has been discovered that encapsulant 818 having molded cavities 823 exposing the conductive posts 804 therefrom and the encapsulant 818 encapsulating the integrated circuit 810 decrease manufacturing costs and time by allowing the elimination of expensive extra process steps like laser ablation, and allows for interlayer dielectric crack inspection after the molding process and also improves performance by allowing finer pitch with the conductive posts 804, a thinner package profile and reduced strip warpage.

Figure 9:
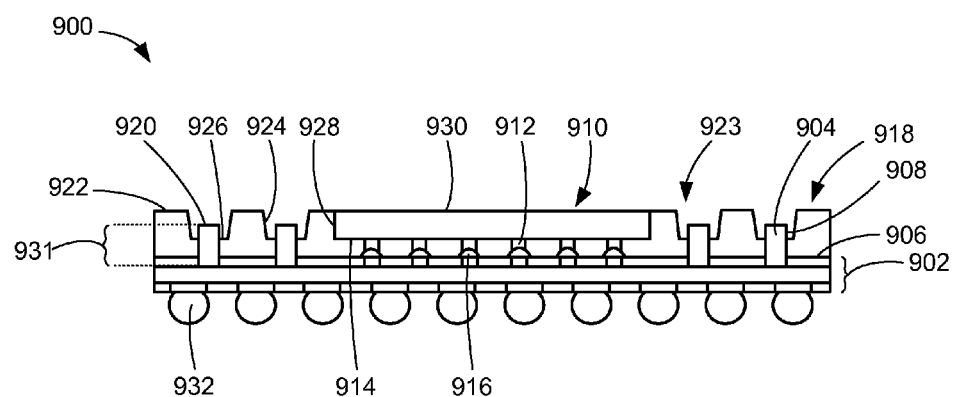
FIG. 9 is a cross-sectional view of an integrated circuit packaging system in a fifth embodiment of the present invention.

Referring now to FIG. 9, therein is shown a cross-sectional view of an integrated circuit packaging system 900 in a fifth embodiment of the present invention. The integrated circuit packaging system 900 is shown having a substrate 902.

The substrate 902 is defined as a structure capable of electrical connection, signal routing with internal signal to signal isolation, and providing structural support for components to be mounted thereto. The substrate 902 can be a rigid or semi-rigid support structure such as laminated plastic or ceramic.

Conductive posts 904 can be formed in direct contact with the substrate 902. The conductive posts 904 can be formed below a top substrate side 906 of the substrate 902 and extend into the substrate 902.

The conductive posts 904 can be an electrically conductive rigid structure such as metal or a conductive polymer. The conductive posts 904 can have vertical sides 908. The vertical sides 908 can be a vertical external surface such as a flat vertical side or a vertical side of an orthogonal cylinder. An integrated circuit 910 can be mounted above the substrate 902. The conductive posts 904 can be arranged in two rows around the integrated circuit 910.

Interconnects 912 can be formed on an active side 914 of the integrated circuit 910. The active side 914 is defined as a side of the integrated circuit 910 having active circuitry fabricated thereon. The active side 914 of the integrated circuit 910 can face the substrate 902 and be distanced from the substrate 902 by the interconnects 912.

The interconnects 912 can be attached to the top substrate side 906 of the substrate 902 with bumps 916 that can be conductive such as solder, a conductive polymer, or other metal. The conductive posts 904, the integrated circuit 910, and the interconnects 912 can have an encapsulant 918 formed thereon.

The encapsulant 918 can be formed by film assisted molding to expose the vertical sides 908 and a top side 920 of the conductive posts 904. The vertical sides 908 of the conductive posts 904 can be in direct contact with the encapsulant 918 near the substrate 902 to provide mechanical stability and exposed near the top side 920 to provide increased connectivity.

The encapsulant 918 can have an upper surface 922 that can be flat and parallel to the substrate 902 and circumscribe molded cavities 923. The encapsulant 918 can also have the molded cavities 923 around the conductive posts 904 and exposing the conductive posts 904 from the encapsulant 918. The molded cavities 923 are defined as a structure formed simultaneously with placement and curing of the encapsulant 918 and not a later process.

The molded cavities 923 can have sloped sidewalls 924 extending toward a bottom cavity surface 926 of the encapsulant 918. The sloped sidewalls 924 can have a slope of greater than horizontal and less than vertical within the molded cavities 923. The bottom cavity surface 926 of the encapsulant 918 can extend from the sloped sidewalls 924 of the encapsulant 918 to directly contact the vertical sides 908 of the conductive posts 904.

The top side 920 of the conductive posts 904 can be below the upper surface 922 of the encapsulant 918 and yet exposed from the encapsulant 918. The conductive posts 904 can extend vertically from the bottom cavity surface 926 of the encapsulant 918.

The encapsulant 918 can also encapsulate the active side 914 and edges 928 of the integrated circuit 910. The upper surface 922 of the encapsulant 918 can directly contact the edges 928 of the integrated circuit 910. The integrated circuit 910 can also have a non-active side 930 that is exposed from the encapsulant 918 and can share the same plane as the upper surface 922 of the encapsulant 918.

It has been discovered that the integrated circuit 910 having a non-active side 930 that is exposed from the encapsulant 918 and can share the same plane as the upper surface 922 of the encapsulant 918 reduces package height.

The non-active side 930 can be positioned above the top side 920 of the conductive posts 904. The vertical sides 908 of the conductive posts 904 can be perpendicular to the top side 920. The conductive posts 904 can have a height 931 larger than the interconnects 912 and the bumps 916 and extend within the edges 928 the integrated circuit 910.

External interconnects 932 can be formed below the substrate 902. The external interconnects 932 can connect the substrate 902 to external board level connections or other devices.

The molded cavities 923 of the encapsulant 918 can be formed by film assisted molding and have the physical characteristics of film assisted molding such as having a surface that oppositely correlates to a mold chase but enlarged by the thickness of a film. The molded cavities 923 of the encapsulant 918 can also have the physical characteristics of surfaces similar to a mirror image of a mold chase but slightly distorted by a film. The encapsulant 918 having the upper surface 922, the sloped sidewalls 924, and the bottom surface 926 can also have the physical characteristics of being smooth, non-pitted, and non-carbonized.

The conductive posts 904 can also have physical characteristics from the film assisted molding process used to form the molded cavities 923 of the encapsulant 918. These physical characteristics can include smooth metal surface, not pitted or melted. The flat sides 908 of the conductive posts 904 can also be cleaner having fewer residues or mold flash of the encapsulant 918 thereon.

It has been discovered that encapsulant 918 having molded cavities 923 exposing the conductive posts 904 therefrom and the encapsulant 918 encapsulating the integrated circuit 910 decrease manufacturing costs and time by allowing the elimination of expensive extra process steps like laser ablation, and allows for interlayer dielectric crack inspection after the molding process and also improves performance by allowing finer pitch with the conductive posts 904, a thinner package profile and reduced strip warpage.

Figure 10:
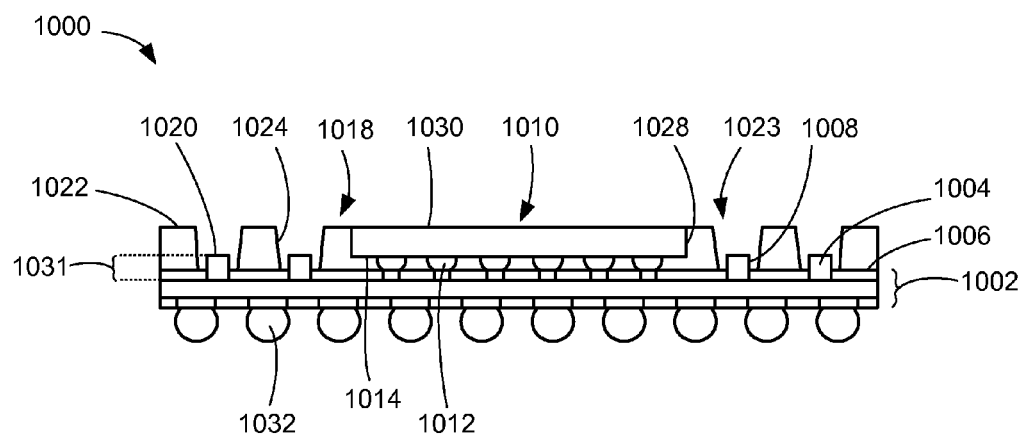
FIG. 10 is a cross-sectional view of an integrated circuit packaging system in a sixth embodiment of the present invention.

Referring now to FIG. 10, therein is shown a cross-sectional view of an integrated circuit packaging system 1000 in a sixth embodiment of the present invention. The integrated circuit packaging system 1000 is shown having a substrate 1002.

The substrate 1002 is defined as a structure capable of electrical connection, signal routing with internal signal to signal isolation, and providing structural support for components to be mounted thereto. The substrate 1002 can be a rigid or semi-rigid support structure such as laminated plastic or ceramic.

Conductive posts 1004 can be formed in direct contact with the substrate 1002. The conductive posts 1004 can be formed below a top substrate side 1006 of the substrate 1002 and extend into the substrate 1002.

The conductive posts 1004 can be an electrically conductive rigid structure such as metal or a conductive polymer. The conductive posts 1004 can have vertical sides 1008. The vertical sides 1008 can be a vertical external surface such as a flat vertical side or a vertical side of an orthogonal cylinder. An integrated circuit 1010 can be mounted above the substrate 1002. The conductive posts 1004 can be arranged in two rows around the integrated circuit 1010.

Interconnects 1012 can be formed on an active side 1014 of the integrated circuit 1010. The interconnects 1012 can be an electrically conductive signal routing structure such as solder, a conductive polymer, or other metal. The active side 1014 is defined as a side of the integrated circuit 1010 having active circuitry fabricated thereon. The active side 1014 of the integrated circuit 1010 can face the substrate 1002 and be distanced from the substrate 1002 by the interconnects 1012.

The conductive posts 1004, the integrated circuit 1010, and the interconnects 1012 can have an encapsulant 1018 formed thereon. The encapsulant 1018 can be formed by film assisted molding to expose the vertical sides 1008 and a top side 1020 of the conductive posts 1004. The vertical sides 1008 of the conductive posts 1004 can be fully exposed from the encapsulant 1018 above the substrate 1002. The Top side 1020 of the conductive posts 1004 can be coplanar with the active side 1014 of the integrated circuit 1010.

The encapsulant 1018 can have an upper surface 1022 that can be flat and parallel to the substrate 1002 and circumscribe molded cavities 1023. The encapsulant 1018 can also have the molded cavities 1023 around the conductive posts 1004 and exposing the conductive posts 1004 from the encapsulant 1018. The molded cavities 1023 are defined as a structure formed simultaneously with placement and curing of the encapsulant 1018 and not a later process.

The molded cavities 1023 can have sloped sidewalls 1024 extending toward the top substrate side 1006 of the substrate 1002. The sloped sidewalls 1024 can have a slope of greater than horizontal and less than vertical within the molded cavities 1023. The top substrate side 1006 of the substrate 1002 can be exposed from the encapsulant 1018 from the sloped sidewalls 1024 of the encapsulant 1018 to the vertical sides 1008 of the conductive posts 1004. The top side 1020 of the conductive posts 1004 can be below the upper surface 1022 of the encapsulant 1018 and yet exposed from the encapsulant 1018.

It has been discovered that the molded cavities 1023 that expose the top substrate side 1006 of the substrate 1002 improves adhesion of the conductive post 1004 to external components.

The encapsulant 1018 can also encapsulate the active side 1014 and edges 1028 of the integrated circuit 1010. The upper surface 1022 of the encapsulant 1018 can directly contact the edges 1028 of the integrated circuit 1010. The integrated circuit 1010 can also have a non-active side 1030 that is exposed from the encapsulant 1018 and can share the same plane as the upper surface 1022 of the encapsulant 1018.

The non-active side 1030 can be positioned above the top side 1020 of the conductive posts 1004. The vertical sides 1008 of the conductive posts 1004 can be perpendicular to the top side 1020. The conductive posts 1004 can have a height 1031 larger than the interconnects 1012 and extend within the edges 1028 of the integrated circuit 1010.

External interconnects 1032 can be formed below the substrate 1002. The external interconnects 1032 can connect the substrate 1002 to external board level connections or other devices.

The molded cavities 1023 of the encapsulant 1018 can be formed by film assisted molding and have the physical characteristics of film assisted molding such as having a surface that oppositely correlates to a mold chase but enlarged by the thickness of a film. The molded cavities 1023 of the encapsulant 1018 can also have the physical characteristics of surfaces similar to a mirror image of a mold chase but slightly distorted by a film. The encapsulant 1018 having the upper surface 1022 and the sloped sidewalls 1024 can also have the physical characteristics of being smooth, non-pitted, and non-carbonized.

The conductive posts 1004 can also have physical characteristics from the film assisted molding process used to form the molded cavities 1023 of the encapsulant 1018. These physical characteristics can include smooth metal surface, not pitted or melted. The flat sides 1008 of the conductive posts 1004 can also be cleaner having fewer residues or mold flash of the encapsulant 1018 thereon.

It has been discovered that encapsulant 1018 having molded cavities 1023 exposing the conductive posts 1004 therefrom and the encapsulant 1018 encapsulating the integrated circuit 1010 decrease manufacturing costs and time by allowing the elimination of expensive extra process steps like laser ablation, and allows for interlayer dielectric crack inspection after the molding process and also improves performance by allowing finer pitch with the conductive posts 1004, a thinner package profile and reduced strip warpage.

Figure 11:
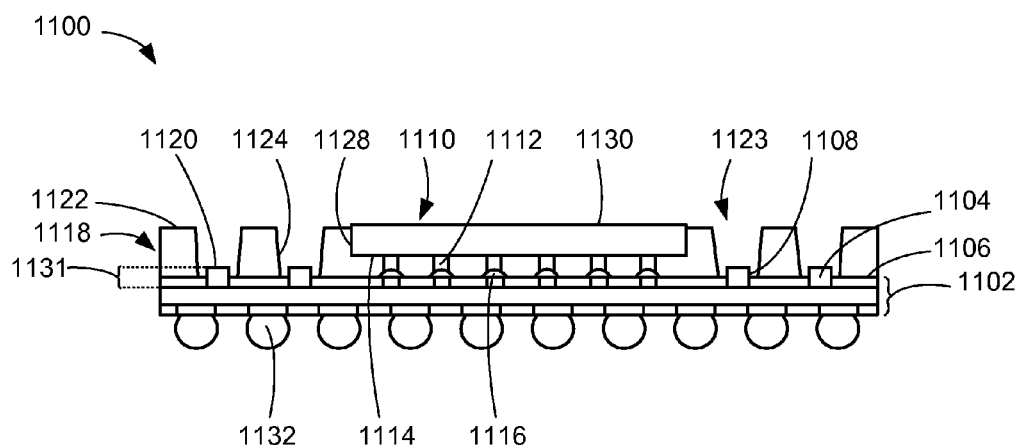
FIG. 11 is a cross-sectional view of an integrated circuit packaging system in a seventh embodiment of the present invention.

Referring now to FIG. 11, therein is shown a cross-sectional view of an integrated circuit packaging system 1100 in a seventh embodiment of the present invention. The integrated circuit packaging system 1100 is shown having a substrate 1102.

The substrate 1102 is defined as a structure capable of electrical connection, signal routing with internal signal to signal isolation, and providing structural support for components to be mounted thereto. The substrate 1102 can be a rigid or semi-rigid support structure such as laminated plastic or ceramic.

Conductive posts 1104 can be formed in direct contact with the substrate 1102. The conductive posts 1104 can be formed below a top substrate side 1106 of the substrate 1102 and extend into the substrate 1102.

The conductive posts 1104 can be an electrically conductive rigid structure such as metal or a conductive polymer. The conductive posts 1104 can have vertical sides 1108. The vertical sides 1108 can be a vertical external surface such as a flat vertical side or a vertical side of an orthogonal cylinder. An integrated circuit 1110 can be mounted above the substrate 1102. The conductive posts 1104 can be arranged in two rows around the integrated circuit 1110.

Interconnects 1112 can be formed on an active side 1114 of the integrated circuit 1110. The active side 1114 is defined as a side of the integrated circuit 1110 having active circuitry fabricated thereon. The active side 1114 of the integrated circuit 1110 can face the substrate 1102 and be distanced from the substrate 1102 by the interconnects 1112. The integrated circuit 1110 can be vertically above the conductive posts 1104.

The interconnects 1112 can be attached to the top substrate side 1106 of the substrate 1102 with bumps 1116 that can be conductive such as solder, a conductive polymer, or other metal. The conductive posts 1104, the integrated circuit 1110, and the interconnects 1112 can have an encapsulant 1118 formed thereon. The encapsulant 1118 can be formed by film assisted molding to expose the vertical sides 1108 and a top side 1120 of the conductive posts 1104. The vertical sides 1108 of the conductive posts 1104 can be fully exposed from the encapsulant 1118 above the substrate 1102.

The encapsulant 1118 can have an upper surface 1122 that can be flat and parallel to the substrate 1102 and circumscribe molded cavities 1123. The encapsulant 1118 can also have the molded cavities 1123 around the conductive posts 1104 and exposing the conductive posts 1104 from the encapsulant 1118. The molded cavities 1123 are defined as a structure formed simultaneously with placement and curing of the encapsulant 1118 and not a later process.

The molded cavities 1123 can have sloped sidewalls 1124 extending toward the top substrate side 1106 of the substrate 1102. The sloped sidewalls 1124 can have a slope of greater than horizontal and less than vertical within the molded cavities 1123. The top substrate side 1106 of the substrate 1102 can be exposed from the encapsulant 1118 from the sloped sidewalls 1124 of the encapsulant 1118 to the vertical sides 1108 of the conductive posts 1104. The top side 1120 of the conductive posts 1104 can be below the upper surface 1122 of the encapsulant 1118 and yet exposed from the encapsulant 1118.

It has been discovered that the molded cavities 1123 that expose the top substrate side 1106 of the substrate 1102 improves adhesion of the conductive post 1104 to external components.

The encapsulant 1118 can also encapsulate the active side 1114 and edges 1128 of the integrated circuit 1110. The top side 1120 of the encapsulant 1118 can extend from the sloped sidewalls 1124 to directly contact the edges 1128. The integrated circuit 1110 can also have a non-active side 1130 that is exposed from the encapsulant 1118. The upper surface 1122 of the encapsulant 1118 can contact the edges 1128 exposing the edges 1128 near the non-active side 1130 and encapsulating the edges 1128 near the active side 1114.

The non-active side 1130 can be positioned above the upper surface 1122 of the encapsulant 1118 and above the top side 1120 of the conductive posts 1104. The vertical sides 1108 of the conductive posts 1104 can be perpendicular to the top side 1120. The conductive posts 1104 can have a height 1131 smaller than the interconnects 1112 and the bumps 1116 and extend below the active side 1114 of the integrated circuit 1110.

External interconnects 1132 can be formed below the substrate 1102. The external interconnects 1132 can connect the substrate 1102 to external board level connections or other devices.

The molded cavities 1123 of the encapsulant 1118 can be formed by film assisted molding and have the physical characteristics of film assisted molding such as having a surface that oppositely correlates to a mold chase but enlarged by the thickness of a film. The molded cavities 1123 of the encapsulant 1118 can also have the physical characteristics of surfaces similar to a mirror image of a mold chase but slightly distorted by a film. The encapsulant 1118 having the upper surface 1122 and the sloped sidewalls 1124 can also have the physical characteristics of being smooth, non-pitted, and non-carbonized.

The conductive posts 1104 can also have physical characteristics from the film assisted molding process used to form the molded cavities 1123 of the encapsulant 1118. These physical characteristics can include smooth metal surface, not pitted or melted. The flat sides 1108 of the conductive posts 1104 can also be cleaner having fewer residues or mold flash of the encapsulant 1118 thereon.

It has been discovered that encapsulant 1118 having molded cavities 1123 exposing the conductive posts 1104 therefrom and the encapsulant 1118 encapsulating the integrated circuit 1110 decrease manufacturing costs and time by allowing the elimination of expensive extra process steps like laser ablation, and allows for interlayer dielectric crack inspection after the molding process and also improves performance by allowing finer pitch with the conductive posts 1104, a thinner package profile and reduced strip warpage.

Figure 12:
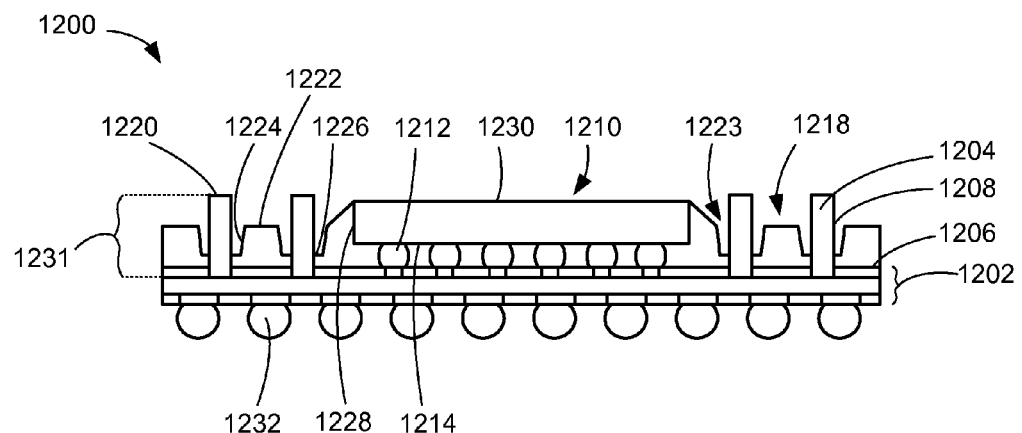
FIG. 12 is a cross-sectional view of an integrated circuit packaging system in an eighth embodiment of the present invention.

Referring now to FIG. 12, therein is shown a cross-sectional view of an integrated circuit packaging system 1200 in an eighth embodiment of the present invention. The integrated circuit packaging system 1200 is shown having a substrate 1202.

The substrate 1202 is defined as a structure capable of electrical connection, signal routing with internal signal to signal isolation, and providing structural support for components to be mounted thereto. The substrate 1202 can be a rigid or semi-rigid support structure such as laminated plastic or ceramic.

Conductive posts 1204 can be formed in direct contact with the substrate 1202. The conductive posts 1204 can be formed below a top substrate side 1206 of the substrate 1202 and extend into the substrate 1202.

The conductive posts 1204 can be an electrically conductive rigid structure such as metal or a conductive polymer. The conductive posts 1204 can have vertical sides 1208. The vertical sides 1208 can be a vertical external surface such as a flat vertical side or a vertical side of an orthogonal cylinder. An integrated circuit 1210 can be mounted above the substrate 1202. The conductive posts 1204 can be arranged in two rows around the integrated circuit 1210.

Interconnects 1212 can be formed on an active side 1214 of the integrated circuit 1210. The interconnects 1212 can be an electrically conductive signal routing structure such as solder, a conductive polymer, or other metal. The active side 1214 is defined as a side of the integrated circuit 1210 having active circuitry fabricated thereon. The active side 1214 of the integrated circuit 1210 can face the substrate 1202 and be distanced from the substrate 1202 by the interconnects 1212.

The conductive posts 1204, the integrated circuit 1210, and the interconnects 1212 can have an encapsulant 1218 formed thereon. The encapsulant 1218 can be formed by film assisted molding to expose the vertical sides 1208 and a top side 1220 of the conductive posts 1204. The vertical sides 1208 of the conductive posts 1204 can be in direct contact with the encapsulant 1218 near the substrate 1202 to provide mechanical stability and exposed near the top side 1220 to provide increased connectivity.

The encapsulant 1218 can have an upper surface 1222 that can be flat and parallel to the substrate 1202 and circumscribe molded cavities 1223. The encapsulant 1218 can also have the molded cavities 1223 around the conductive posts 1204 and exposing the conductive posts 1204 from the encapsulant 1218. The molded cavities 1223 are defined as a structure formed simultaneously with placement and curing of the encapsulant 1218 and not a later process.

The molded cavities 1223 can have sloped sidewalls 1224 extending toward a bottom cavity surface 1226 of the encapsulant 1218. The sloped sidewalls 1224 can have a slope of greater than horizontal and less than vertical within the molded cavities 1223. The bottom cavity surface 1226 of the encapsulant 1218 can extend from the sloped sidewalls 1224 of the encapsulant 1218 to directly contact the vertical sides 1208 of the conductive posts 1204.

The top side 1220 of the conductive posts 1204 can be above the upper surface 1222 of the encapsulant 1218 and yet exposed from the encapsulant 1218 below the upper surface 1222. The conductive posts 1204 can extend vertically from the bottom cavity surface 1226 of the encapsulant 1218.

The encapsulant 1218 can also encapsulate the active side 1214 and edges 1228 of the integrated circuit 1210. The encapsulant 1218 can extend from the sloped sidewalls 1224 to directly contact the edges 1228. The integrated circuit 1210 can also have a non-active side 1230 that is exposed from the encapsulant 1218.

The non-active side 1230 can be positioned above the upper surface 1222 of the encapsulant 1218 and share a plane with the top side 1220 of the conductive posts 1204 or can be below the top side 1220 of the conductive posts 1204. The vertical sides 1208 of the conductive posts 1204 can be perpendicular to the top side 1220. The conductive posts 1204 can have a height 1231 larger than the interconnects 1212 and the integrated circuit 1210 together and extend above the non-active side 1230 of the integrated circuit 1210.

External interconnects 1232 can be formed below the substrate 1202. The external interconnects 1232 can connect the substrate 1202 to external board level connections or other devices.

The molded cavities 1223 of the encapsulant 1218 can be formed by film assisted molding and have the physical characteristics of film assisted molding such as having a surface that oppositely correlates to a mold chase but enlarged by the thickness of a film. The molded cavities 1223 of the encapsulant 1218 can also have the physical characteristics of surfaces similar to a mirror image of a mold chase but slightly distorted by a film. The encapsulant 1218 having the upper surface 1222, the sloped sidewalls 1224, and the bottom surface 1226 can also have the physical characteristics of being smooth, non-pitted, and non-carbonized.

The conductive posts 1204 can also have physical characteristics from the film assisted molding process used to form the molded cavities 1223 of the encapsulant 1218. These physical characteristics can include smooth metal surface, not pitted or melted. The flat sides 1208 of the conductive posts 1204 can also be cleaner having fewer residues or mold flash of the encapsulant 1218 thereon.

It has been discovered that encapsulant 1218 having molded cavities 1223 exposing the conductive posts 1204 therefrom and the encapsulant 1218 encapsulating the integrated circuit 1210 decrease manufacturing costs and time by allowing the elimination of expensive extra process steps like laser ablation, and allows for interlayer dielectric crack inspection after the molding process and also improves performance by allowing finer pitch with the conductive posts 1204, a thinner package profile and reduced strip warpage.

Figure 13:
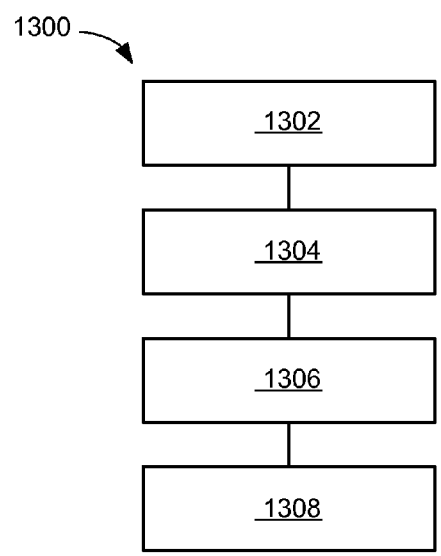
FIG. 13 is a flow chart of a method of manufacture of the integrated circuit packaging system in a further embodiment of the present invention.

Referring now to FIG. 13, therein is shown a flow chart of a method 1300 of manufacture of the integrated circuit packaging system in a further embodiment of the present invention. The method 1300 includes: providing a substrate in a block 1302; forming a conductive post on the substrate, the conductive post includes a vertical side in a block 1304; attaching an integrated circuit to the substrate in a block 1306; and forming an encapsulant including a molded cavity, the vertical side circumscribed by and exposed within the molded cavity from the encapsulant in a block 1308.

Thus, it has been discovered that the integrated circuit packaging system and molded cavities around conductive posts of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
a substrate;
a conductive post formed on the substrate, the conductive post includes a top side and a vertical side perpendicular to the top side;
an integrated circuit attached to the substrate; and
an encapsulant including a molded cavity, the conductive post circumscribed by the encapsulant and the vertical side exposed within the molded cavity from the encapsulant, wherein the encapsulant includes a bottom cavity surface in the molded cavity covering the substrate.

2. The system as claimed in claim 1 wherein the substrate is exposed within the molded cavity.

3. The system as claimed in claim 1 wherein:
the encapsulant has an upper surface; and
the integrated circuit has a non-active side coplanar with the upper surface.

4. The system as claimed in claim 1 wherein the encapsulant encapsulates the integrated circuit above the conductive post.

5. The system as claimed in claim 1 wherein:
the substrate has a top substrate side;
the conductive post is formed below the top substrate side of the substrate and above the top substrate side of the substrate; and
further comprising:
an interconnect attached between the integrated circuit to the substrate.

6. The system as claimed in claim 5 wherein the encapsulant has an upper surface above the conductive post.

7. The system as claimed in claim 5 further comprising a bump to connect between the interconnect and the substrate.

8. The system as claimed in claim 5 wherein the encapsulant has an upper surface, and the conductive post extends above the upper surface.

9. The system as claimed in claim 5 wherein the integrated circuit has an active side above the conductive post.

* * * * *